United States Patent
Sung et al.

(10) Patent No.: US 7,746,684 B2
(45) Date of Patent: Jun. 29, 2010

(54) OPERATING PROCESS OF ORGANIC DEVICE

(75) Inventors: Chao-Feng Sung, Miaoli County (TW); Je-Ping Hu, Hsinchu (TW); Yang Yang, Los Angeles, CA (US)

(73) Assignee: Industrial Technology Research Institute, Hsinchu (TW)

( * ) Notice: Subject to any disclaimer, the term of this patent is extended or adjusted under 35 U.S.C. 154(b) by 80 days.

(21) Appl. No.: 12/258,450

(22) Filed: Oct. 27, 2008

(65) Prior Publication Data
US 2009/0052228 A1    Feb. 26, 2009

Related U.S. Application Data

(62) Division of application No. 11/309,095, filed on Jun. 22, 2006.

(30) Foreign Application Priority Data
Dec. 30, 2005    (TW) .............................. 94147723 A (51) Int. Cl.
G11C 11/00    (2006.01)
(52) U.S. Cl. ............. 365/148; 365/185.28; 365/185.29; 365/163

(58) Field of Classification Search ................. 365/148, 365/185.28–185.29, 163, 151
See application file for complete search history.

(56) References Cited

U.S. PATENT DOCUMENTS
6,867,996 B2 *    3/2005    Campbell et al. ........... 365/148

* cited by examiner

*Primary Examiner*—David Lam
(74) *Attorney, Agent, or Firm*—Jianq Chyun IP Office (57) ABSTRACT

An operating process of an organic device includes performing a programming process and an erasing process. The programming process includes steps of applying a first positive bias from the first electrode to the second electrode on the organic device so that a conductive state of the organic device is switched to be a first turn-on state when the organic device is in a turn-off state and applying a negative bias from the first electrode to the second electrode on the organic device so that the conductive state of the organic device is switched to be a second turn-on state when the organic device is in the first turn-on state. The erasing process includes a step of applying a second positive bias from the first electrode to the second electrode on the organic device so that the conductive state of the organic device is switched to be the turn-off state.

2 Claims, 6 Drawing Sheets

OPERATING PROCESS OF ORGANIC DEVICE

CROSS-REFERENCE TO RELATED APPLICATION

This application is a divisional of an application Ser. No. 11/309,095, filed on Jun. 22, 2006, now pending, which claims the priority benefit of Taiwan application Ser. No. 94147723, filed on Dec. 30, 2005. The entirety of each of the above-mentioned patent applications is hereby incorporated by reference herein and made a part of this specification.

BACKGROUND OF THE INVENTION

1. Field of Invention

The present invention relates to an organic memory device and method for manufacturing the same. More particularly, the present invention relates to an organic multi-stable device and the method for manufacturing the same.

2. Description of Related Art

In recent years, a bi-stable device switched between the high and low resistivity states is applied in manufacturing a memory device and the switch according to different applied voltages. The material with the switch property and storage ability includes inorganic and organic materials. It should be noticed that the bi-stable memory device manufactured by applying such materials between two electrodes has got the potential of becoming a new-generation non-volatile memory device.

The bi-stable memory, the common memory device and the switch are single-bit structure. That is, one device only possesses two states which are 0 and 1. If single device can express multiple states, the numbers of the devices and the area for the devices for storing a fix amount of the memory can be decreased. Moreover, the organic light emitting diode can be driven by a single device to achieve the gray scale control.

Hence, how to manufacture a multi-stable memory and a multi-stable switch becomes one of the important development tasks.

SUMMARY OF THE INVENTION

The present invention is related to provide a tri-stable device capable of possessing multiple stable states so that the number of the devices is decreased and the area of the circuit is decreased as well.

The present invention is further related to provide a method for manufacturing a tri-stable device. The tri-stable device manufactured by the method according to the present invention possesses metal ions in the organic layer thereof. By controlling the content of the metal ions in the organic layer, the conductivity of the organic device can be well controlled and the stability of the device is increased.

The present invention is further related to provide an operating process capable of controlling the multi-stable states expressed by the organic device.

The present invention provides an organic tri-stable device. The organic tri-stable device comprises a first electrode, a second electrode, a diffusion barrier layer, a first organic mixture layer and a second organic mixture layer. The diffusion barrier layer is located between the first electrode and the second electrode. The first organic mixture layer is located between the first electrode and the diffusion barrier layer. The second organic mixture layer is located between the second electrode and the diffusion barrier layer.

In the organic tri-stable device according to a preferred embodiment of the present invention, a first buffer layer and a second buffer layer are disposed on a first surface of the first electrode and a second surface of the second electrode respectively and contact the first organic mixture layer and the second organic mixture layer respectively.

In the organic tri-stable device according to a preferred embodiment of the present invention, the materials of the first buffer layer and the second buffer layer are materials with high dielectric constant, including $Al_2OX$, LiF, MgO, $V_2O_5$, or TiO2.

In the organic tri-stable device according to a preferred embodiment of the present invention, the materials of the first electrode and the material of the second electrode are respectively selected from a group consisting of copper, gold, silver, aluminum, cobalt, or nickel.

In the organic tri-stable device according to a preferred embodiment of the present invention, the first organic mixture layer and the second organic mixture layer are prepared by using an organic material as a primary material mixing with a metal material.

In the organic tri-stable device according to a preferred embodiment of the present invention, the organic material comprises Alq, AlDCN, CuPc, or polymeric organic semiconductor material including DH6T, DHADT, P3HT.

In the organic tri-stable device according to a preferred embodiment of the present invention, the metal material is selected from a group consisting of copper, gold, silver, aluminum, cobalt, nickel, or the alloys thereof.

In the organic tri-stable device according to a preferred embodiment of the present invention, the ratio of the organic material to the metal material is 5~100 in the first organic mixture layer and the second organic mixture layer.

In the organic tri-stable device according to a preferred embodiment of the present invention, the material of the diffusion barrier layer is selected from a group consisting of indium, tantalum, titanium, tungsten, molybdenum, niobium, chromium, aluminum, indium tin oxide. $TiO_2$, TaN, FCN, WN, other metal oxide materials and metal nitride materials.

In the organic tri-stable device according to a preferred embodiment of the present invention, the conductive constant of the first organic mixture layer is different from that of the second organic mixture layer.

The present invention also provides a method for manufacturing an organic tri-stable device on a substrate. The method comprises the steps of forming a first metal layer on the substrate. A first organic mixture layer is formed over the first metal layer and a diffusion barrier layer is formed over the first metal layer. A second organic mixture layer is formed on the diffusion barrier layer and a second metal layer is formed over the second organic mixture layer.

In the method for manufacturing an organic tri-stable device according to the present invention, the method for forming the diffusion barrier layer is selected from a group consisting of an evaporation process and a printing process.

In the method for manufacturing an organic tri-stable device according to a preferred embodiment of the present invention, the material of the diffusion barrier layer is selected from a group consisting of indium, tantalum, titanium, tungsten, molybdenum, niobium, chromium, aluminum, indium tin oxide, $TiO_2$, TaN, FCN, WN, other metal oxide materials and metal nitride materials.

In the method for manufacturing an organic tri-stable device according to a preferred embodiment of the present invention, the methods for forming the first organic mixture layer and the second organic mixture layer comprise step of performing a thermal evaporation, wherein a metal material and an organic material are evaporated at the same time.

In the method for manufacturing an organic tri-stable device according to a preferred embodiment of the present invention, the evaporation speed of the organic material is different from that of the metal material.

In the method for manufacturing an organic tri-stable device according to a preferred embodiment of the present invention, the methods for forming the first organic mixture layer and the second organic mixture layer comprise step of performing a printing process with the use of a mixture solution having an organic material and a metal material.

In the method for manufacturing an organic tri-stable device according to a preferred embodiment of the present invention, a first buffer layer is formed between the first metal layer and the first organic mixture layer.

In the method for manufacturing an organic tri-stable device according to a preferred embodiment of the present invention, a second buffer layer is formed between the second organic mixture layer and the second metal layer.

The present invention further provides an operating process of an organic device, wherein the organic device comprises a first electrode, a second electrode, a diffusion barrier layer between the first electrode and the second electrode. The operating process comprises steps of performing a programming process and an erasing process. The programming process comprises steps of applying a first positive bias from the first electrode to the second electrode on the organic device so that a conductive state of the organic device is switched to be a first turn-on state when the organic device is at a turn-off state and applying a negative bias from the first electrode to the second electrode on the organic device so that the conductive state of the organic device is switched to be a second turn-on state when the organic device is at the first turn-on state. The erasing process comprises a step of applying a second positive bias from the first electrode to the second electrode on the organic device so that the conductive state of the organic device is switched to be the turn-off state.

In the operating process of the organic device according to a preferred embodiment of the present invention, first positive bias is lower than the second positive bias.

In the organic tri-stable device according to the present invention, by using a mixing evaporation process, the metal ions are added into the organic layer at the time the organic layer is formed. When an operating process is performed to turn on or turn off the organic device, the conductivity of the organic device can be controlled by adjusting the content of the metal ions in the organic layer. Furthermore, the diffusion barrier layer for blocking the copper diffusion effect can join the organic layers with different conductivity. Also, by applying the positive bias and the negative bias, the three-stable states can be obtained and read.

In order to the make the aforementioned and other features and advantages of the present invention apparent, the preferred embodiments in accompany with drawings are described in detail below.

DESCRIPTION OF EMBODIMENTS

FIGS. 1A to 1E are cross-sectional views illustrating a method for manufacturing an organic tri-stable device according to a preferred embodiment of the present invention.

Figure 1A:
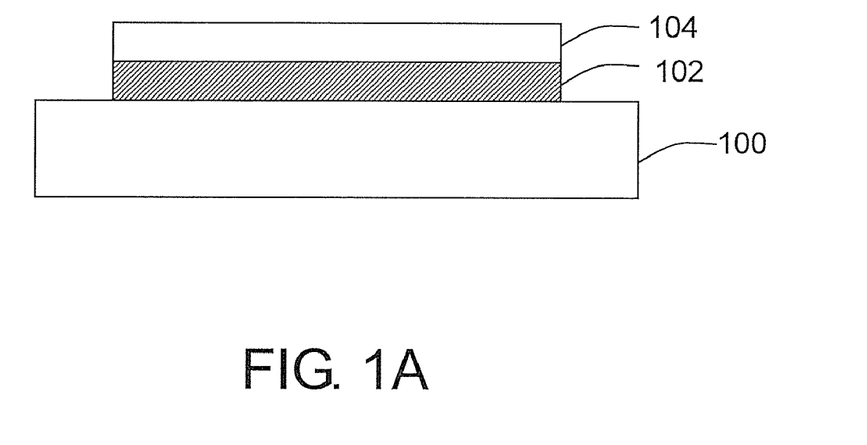
FIGS. 1A to 1E are cross-sectional views illustrating a method for manufacturing an organic tri-stable device according to a preferred embodiment of the present invention.

Referring to FIG. 1A, a substrate 100 is provided. A metal layer 102 is formed on the substrate 100. The material of the metal layer 102 can be, for example but not limited to, copper, gold, silver, aluminum, cobalt, or nickel. Furthermore, the thickness of the metal layer 102 is about 700 Å. Moreover, the method for forming the metal layer can be, for example, an evaporation process or a printing process. The printing process can, for example, include the imprinting process, the screen printing, the slot coating process, the silk printing process, the ink-jet printing process, the liquid toner printing process or other adequate printing process. Then, a buffer layer 104 is formed on the metal layer 102, wherein the buffer layer 104 is, for example, made of the material with high dielectric constant. Preferably, the material includes $Al_2OX$, LiF, MgO, $V_2O_5$, or $TiO_2$. In addition, the thickness of the buffer layer 104 is about 40 Å. The method for forming the buffer layer 104 comprises a step of performing an evaporation process to increase the thickness of the thin film with an evaporation rate of about 0.2 angstroms per second.

Figure 1B:
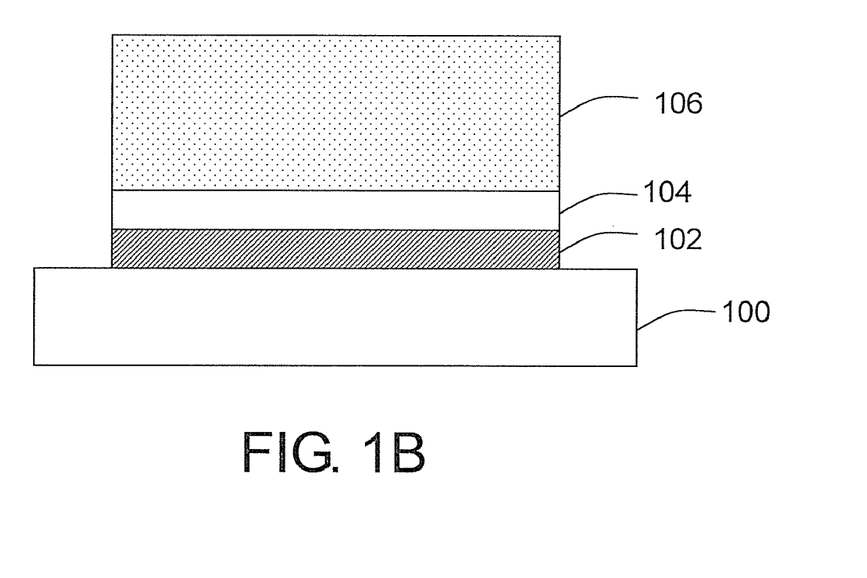

Then, as shown in FIG. 1B, an organic mixture layer 106 is formed on the buffer layer 104. The thickness of the organic mixture layer 106 is about 700 angstroms. The method for forming the organic mixture layer 106 comprises a step of performing the printing process, wherein the mixed solution containing an organic material and a metal material are printed on the buffer layer 104. The printing process can also be, for example, an imprinting process, the screen printing, the slot coating process, the silk printing process, the ink-jet printing process, the liquid toner printing process or other adequate printing process. Furthermore, the mixed solution can be, for example, an organic solution having particles of copper, gold, silver, aluminum, cobalt, nickel, or the alloys thereof. In addition, in the mixed solution, the ratio of the organic material to that of the metal material is about 1~1000, preferably 5~100.

Figure 2:
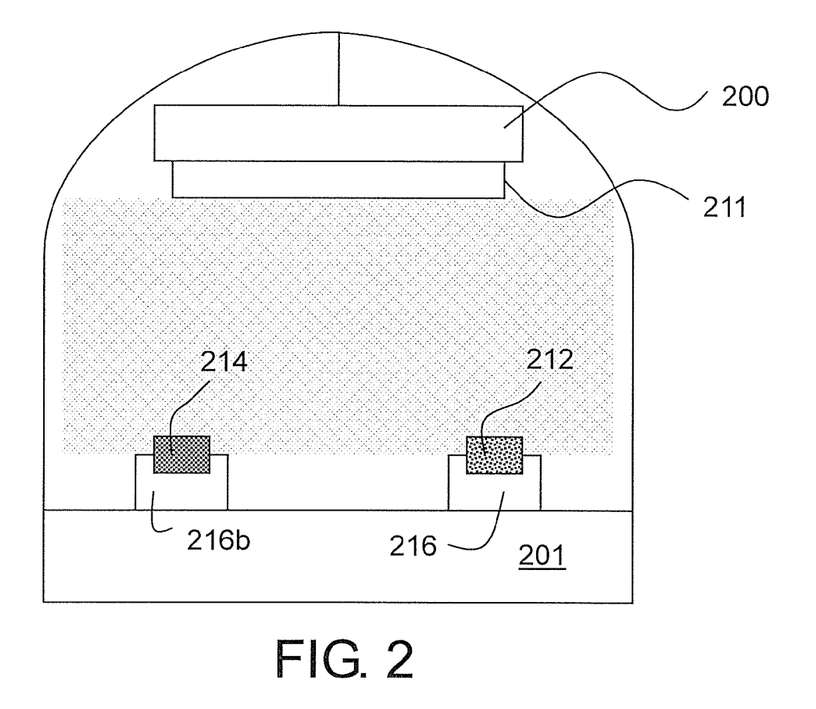
FIG. 2 is a cross-sectional view of the evaporation device used in the method for manufacturing an organic tri-stable device according to a preferred embodiment of the present invention.

Furthermore, the preferred method for forming the organic mixture layer 106 comprises a step of performing the thermal evaporation process, wherein the evaporation source used in the thermal evaporation process comprises a metal material and an organic material. That is, the metal material and the organic material are evaporated onto the buffer layer 104 at the same time. FIG. 2 is a cross-sectional view of the evaporation device used in the method for manufacturing an organic tri-stable device according to a preferred embodiment of the present invention. As shown in FIG. 2, in an evaporation tool 210, an organic material source 212 and a metal material source 214 are disposed on the boats 216a and 216b respectively. When the above thermal evaporation process is performed, the organic material source 212 and metal material source 214 carried by the boats 216a and 216b are melted and evaporated. Then, the particles of organic material and metal material are deposited on the surface of the substrate 211 on the evaporation carrier 200. In this embodiment, it should be noticed that the evaporation rate of the organic material is different from that of the metal material. Preferably, the ratio of the evaporation rate of the organic material to that of the metal material is about 24. Also, in the organic mixture layer 106, the ratio of the organic material to that of the metal material is about 1~1000, preferably 5~100. In addition, the organic material can be aqueous solution, such as Alq aqueous solution, AIDCN aqueous solution, or CuPc aqueous solution, or polymeric organic semiconductor material including DH6T, DHADT, P3HT. The metal material can be, for example, copper, gold, silver, aluminum, cobalt, nickel, or the alloys thereof.

Figure 1C:
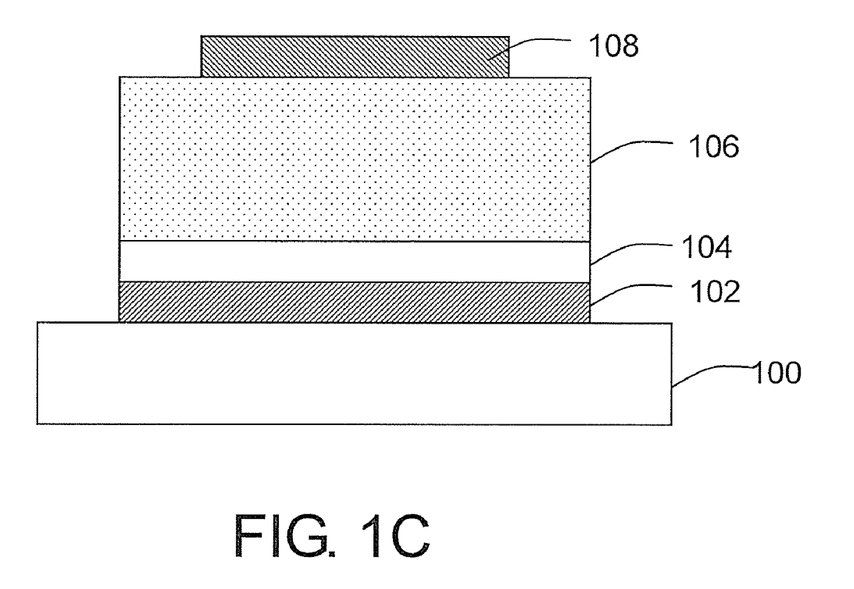

Furthermore, as shown in FIG. 1C, a diffusion barrier layer 108 is formed on the organic mixture layer 106. The diffusion barrier layer 108 can be, for example but not limited to, made of indium, tantalum, titanium, tungsten, molybdenum, niobium, chromium, aluminum or the alloy thereof. Also, the diffusion barrier layer 108 can be, for example but not limited to, made of indium tin oxide, $TiO_2$, TaN, FCN, WN, other metal oxide materials or metal nitride materials. The thickness of the diffusion barrier layer 108 us about 500 angstroms. The method for forming the diffusion barrier layer 108 includes the evaporation process and the printing process. The printing process can be, for example but not limited to, the imprinting process, the screen printing, the slot coating process, the silk printing process, the ink-jet printing process, the liquid toner printing process or other adequate printing process.

Figure 1D:
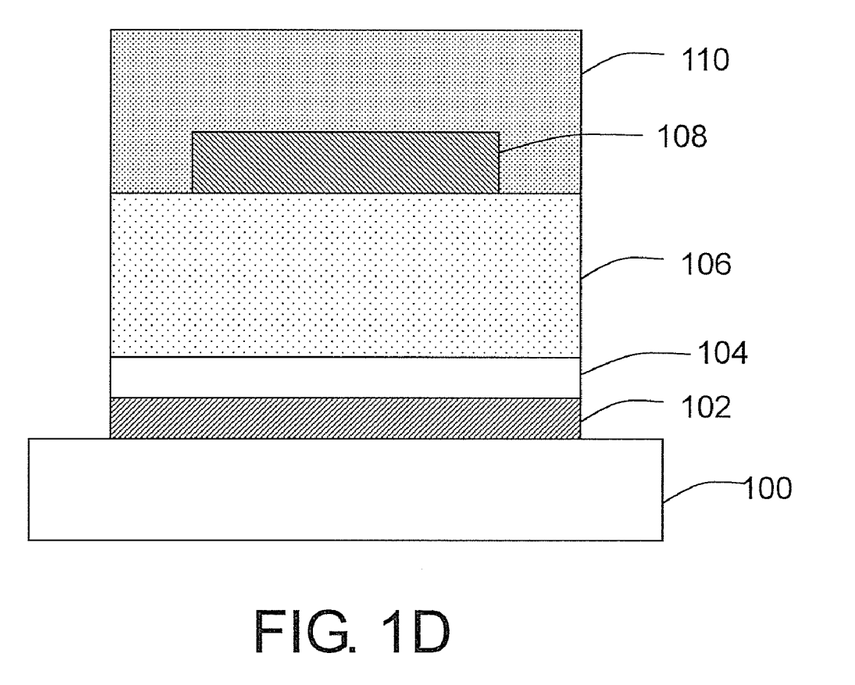
Figure 1E:
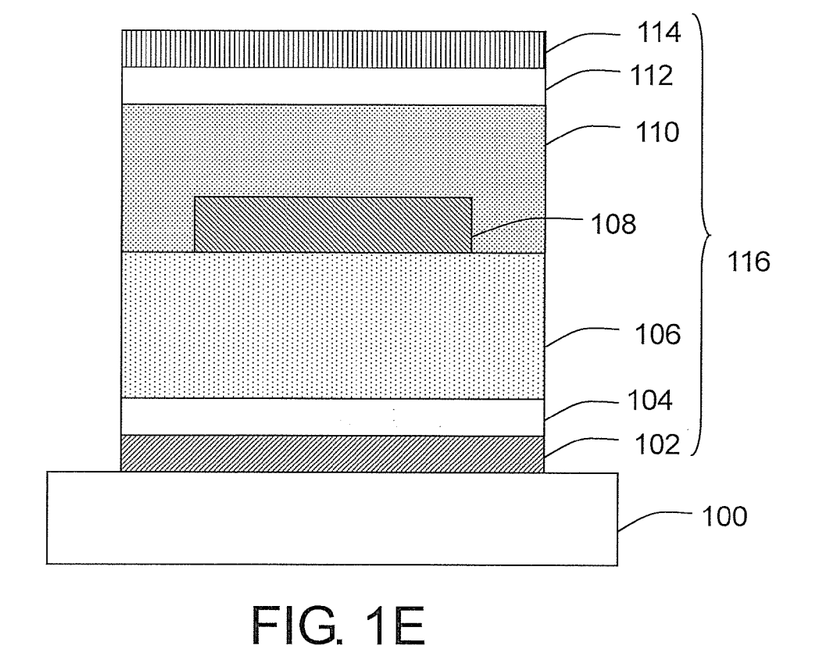

As shown in FIG. 1D, an organic mixture layer 110 is formed over the metal layer 102. The thickness of the organic mixture layer 110 is about 700 angstroms. The method for forming the organic mixture layer 110 comprises a step of performing the printing process, wherein the mixed solution containing an organic material and a metal material are printed over the metal layer 102. The printing process can also be, for example, an imprinting process, the screen printing, the slot coating process, the silk printing process, the ink-jet printing process, the liquid toner printing process or other adequate printing process. Furthermore, the mixed solution includes an organic solution having particles of copper, gold, silver, aluminum, cobalt, nickel, or the alloys thereof. In addition, in the mixed solution, the ratio of the organic material to that of the metal material is about 1~1000, preferably 5~100.

Furthermore, the preferred method for forming the organic mixture layer 110 comprises a step of performing the thermal evaporation process, wherein a metal material and an organic material are evaporated onto the metal layer 102 at the same time. As shown in FIG. 2, in the evaporation tool 210, the organic material source 212 and the metal material source 214 are disposed on the boats 216a and 216b respectively. When the above thermal evaporation process is performed, the organic material source 212 and metal material source 214 carried by the boats 216a and 216b are melted and evaporated. Then, the particles of organic material and metal material are deposited over the surface of the substrate 211 on the evaporation carrier 200. In this embodiment, it should be noticed that the evaporation rate of the organic material is different from that of the metal material in the formation of the organic mixture layer 110. Preferably, the ratio of the evaporation rate of the organic material to that of the metal material is about 12. Also, in the organic mixture layer 110, the ratio of the organic material to that of the metal material is about 1~1000, preferably 5~100. In addition, the organic material can be aqueous solution, such as Alq aqueous solution, AIDCN aqueous solution, or CuPc aqueous solution, or polymeric organic semiconductor material including DH6T, DHADT, P3HT. The metal material can be, for example, copper, gold, silver, aluminum, cobalt, nickel, or the alloys thereof.

It should be noticed that in this embodiment, the ratio of the evaporation rate of the organic material to that of the metal material for forming the organic mixture layer 106 is larger than that for forming the organic mixture layer 110. However, the present invention is not limited to the aforementioned ratio. Preferably, when the tri-stable device is at the turn-off state, the conductive constant of the organic mixture layer 106 is higher than that of the organic mixture layer 110. That is, the conductive constants of the organic mixture layers at both sides of the diffusion barrier layer 108 are different from each other.

As shown in FIG. 1B, a buffer layer 112 and a metal layer 114 are formed on the organic mixture layer 110 sequentially. The buffer layer 112 is, for example, made of the material with high dielectric constant. Preferably, the material with the high dielectric constant includes $Al_2OX$, LiF, MgO, $V_2O_5$, or $TiO_2$. In addition, the thickness of the buffer layer 112 is about 40 Å. The method for forming the buffer layer 112 comprises a step of performing an evaporation process to increase the thickness of the thin film with an evaporation rate of about 0.2 angstroms per second.

The material of the metal layer 114 comprises copper, gold, silver, aluminum, cobalt, or nickel and the thickness of the metal layer 114 is about 700 Å. Also, the method for forming the metal layer 114 can be, for example but not limited to, the evaporation process or the printing process. The printing process can also be, for example, an imprinting process, the screen printing, the slot coating process, the silk printing process, the ink-jet printing process, the liquid toner printing process or other adequate printing process. Therefore, the manufacture of an organic tri-stable device 116 is accomplished. The metal layer 102 and the metal layer 114 are the electrodes of the organic tri-stable device.

Figure 3A:
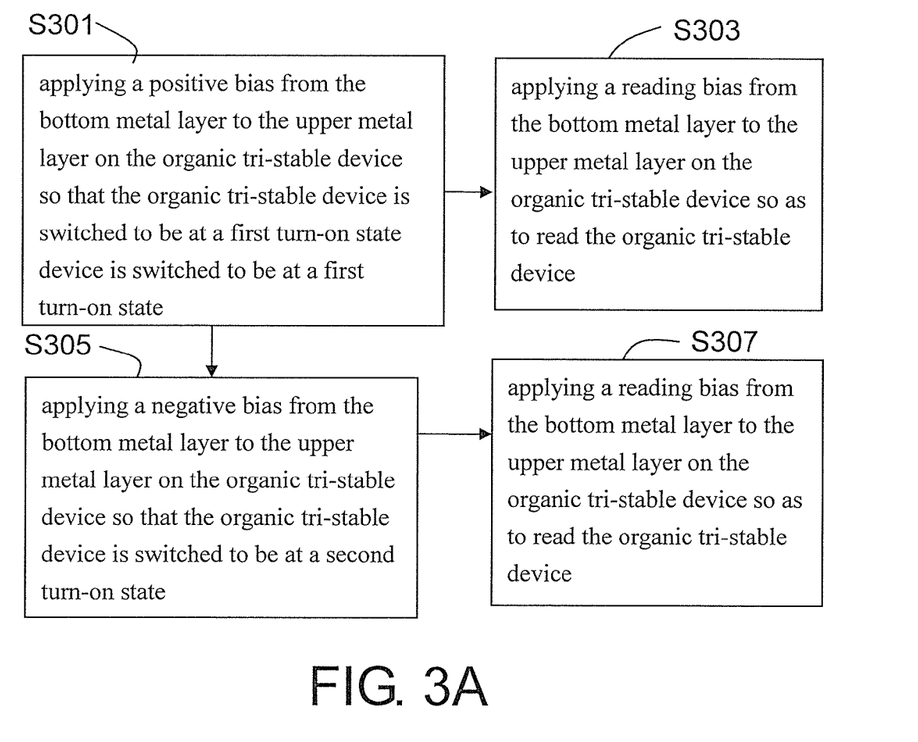
FIG. 3A is a flow chart showing a programming-and-reading process of an organic tri-stable device according to one embodiment of the present invention.

FIG. 3A is a flow chart showing a programming-and-reading process of an organic tri-stable device according to one embodiment of the present invention. As shown in FIG. 3A together with FIG. 1E, under the circumstance that the organic tri-stable device 116 is at a turn-off state, a positive bias from the bottom metal layer 102 to the upper metal layer 114 is applied on the organic tri-stable device 116 so as to form an electric field in the organic mixture layer 106. Hence, the metal ions of the metal layer 102 are driven to diffuse by the electric field. When the metal ions diffuse to reach the organic mixture layer 106, the conductive state of the organic tri-stable device 116 is switched to be a first turn-on state so as to accomplish a programming operation (step S301). The aforementioned positive bias can be, for example, accomplished by applying a positive voltage on the bottom metal layer 102 and grounding the upper metal layer 114, wherein the positive voltage applied on the bottom metal layer 102 is about 1.5 V.

When the organic tri-stable device 116 is at the first turn-on state, the method for reading this organic tri-stable device 116 comprises steps of applying a reading bias and reading the corresponding current value (step S303). The aforementioned reading bias applied on the organic tri-stable device 116 can be, for example, accomplished by applying a positive voltage on the bottom metal layer 102 and grounding the upper metal layer 114. The positive voltage applied on the bottom metal layer 102 is about 0.1 V.

Moreover, when the organic tri-stable device 116 is at the first turn-on state, a reverse bias from the bottom metal layer 102 to the upper metal layer 114 is applied the organic tri-stable device 116 so as to generate an electric field in the organic mixture layer 110. Therefore, the metal ions of the metal layer 114 are driven to diffuse by the electric field. When the metal ions diffuse to reach the organic mixture layer 110, the conductive state of the organic tri-stable device 116 is switched to be a second turn-on state so as to accomplish another programming operation (step S305). The aforementioned negative bias can be, for example, accomplished by applying a positive voltage on the upper metal layer 114 and grounding the bottom metal layer 102, wherein the positive voltage applied on the upper metal layer 114 is about 1.5 V.

When the organic tri-stable device 116 is at the second turn-on state, the method for reading this organic tri-stable device 116 comprises steps of applying a reading bias and reading the corresponding current value (step S303). The aforementioned reading bias applied on the organic tri-stable device 116 can be, for example, accomplished by applying a positive voltage on the bottom metal layer 102 and grounding the upper metal layer 114. The positive voltage applied on the bottom metal layer 102 is about 0.1 V.

In this embodiment, the programming operation (process) for switching the conductive state of the organic tri-stable device to be the first turn-on state and the second turn-on state can be accomplished by performing the operating process on the organic mixture layer 106 and the bottom metal layer 102 under the diffusion barrier layer 108 so as to switch the organic tri-stable device to be at the first turn-on state and then performing the operating process on the organic mixture layer 110 and the upper metal layer 114 above the diffusion barrier layer 108 so as to switch the organic tri-stable device to be at the second turn-on state. However, the present invention is not limited to the programming operation mentioned in the embodiment.

Figure 3B:
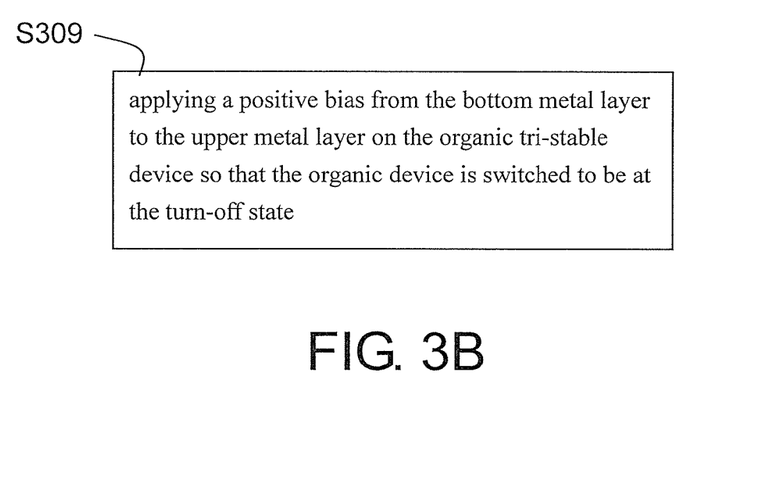
FIG. 3B is a flow chart showing an erasing process of an organic tri-stable device according to one embodiment of the present invention.

FIG. 3B is a flow chart showing an erasing process of an organic tri-stable device according to one embodiment of the present invention. As shown in FIG. 3B together with FIG. 1E, when an erasing process is performed on the organic tri-stable device 116, a positive bias from the bottom metal layer 102 to the upper metal layer 114 is applied on the organic tri-stable device 116 so as to generate an electric field in the organic mixture layers 106 and 110. Accordingly, the metal ions are driven to drift back to the metal layers 102 and 114. Therefore, the organic tri-stable device 116 is switched to be at a turn-off state and the erasing process is accomplished (step S309). After the erasing process, if a reading bias is applied on the organic tri-stable device 116, no reading current value can be measured since the organic tri-stable device 116 is at the turn-off state. The aforementioned positive bias applied on the organic tri-stable device 116 can be, for example, accomplished by applying a positive voltage on the bottom metal layer 102 and grounding the upper metal layer 114. The positive voltage applied on the bottom metal layer 102 is about 5 V. It should be noticed that both absolute values of the positive bias and the negative bias applied on the organic tri-stable device 116 in the programming process are smaller than the absolute value of the positive bias applied on the organic tri-stable device 116.

Figure 4:
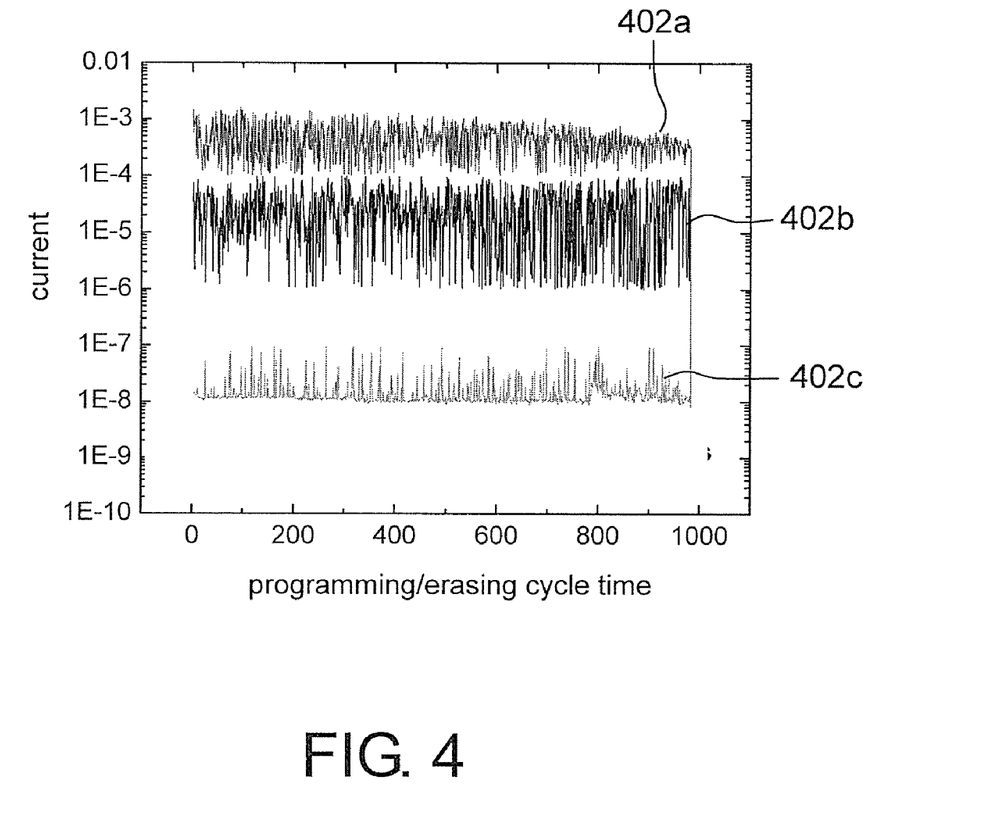
FIG. 4 is a current-programming/erasing cycle time plot diagram of an organic tri-stable device according to a preferred embodiment of the present invention.

FIG. 4 is a current-programming/erasing cycle time plot diagram of an organic tri-stable device according to a preferred embodiment of the present invention. As shown in FIG. 4, the curve 402a indicates a programming current variation curve along with the increasing of the programming/erasing cycle times, when the programming process is performed on the organic tri-stable device so as to switch the conductive state of the organic tri-stable device to be the first turn-on state. Moreover, the curve 402b indicates a programming current variation curve along with the increasing of the programming/erasing cycle times, when the programming process is performed on the organic tri-stable device so as to switch the conductive state of the organic tri-stable device to be the second turn-on state. Furthermore, the curve 402c indicates the erasing current variation curve along with the increasing of the programming/erasing cycle times, when the erasing process is performed on the organic tri-stable device. Apparently, during the duration that programming/erasing cycle is about 1000 times, the erasing current value of the organic tri-stable device remains steady. Similarly, the programming current values of the programming processes for switching the conductive states of the organic tri-stable device to be the first turn-on state and the second turn-on state respectively maintain at the steady states. That is, by arranging the diffusion barrier layer between the organic mixture layers, two portions of the organic tri-stable device disposed at each side of the diffusion barrier layer can be programmed individually. The metal material ions doped in the organic mixture layers are used as the mediators for injecting electrons during the operation of the organic tri-stable device so that the programming/erasing cycle times of the organic tri-stable device can be increased and the lifetime of the organic tri-stable device is also effectively increased.

Figure 5:
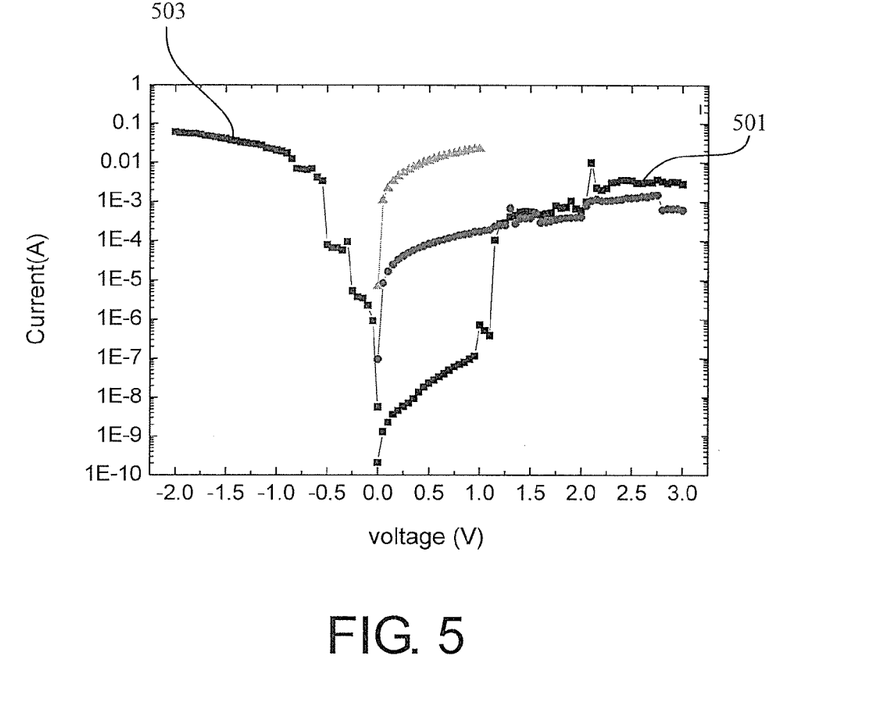
FIG. 5 is a current-voltage plot diagram of an organic tri-stable device according to a preferred embodiment of the present invention.
Figure 6:
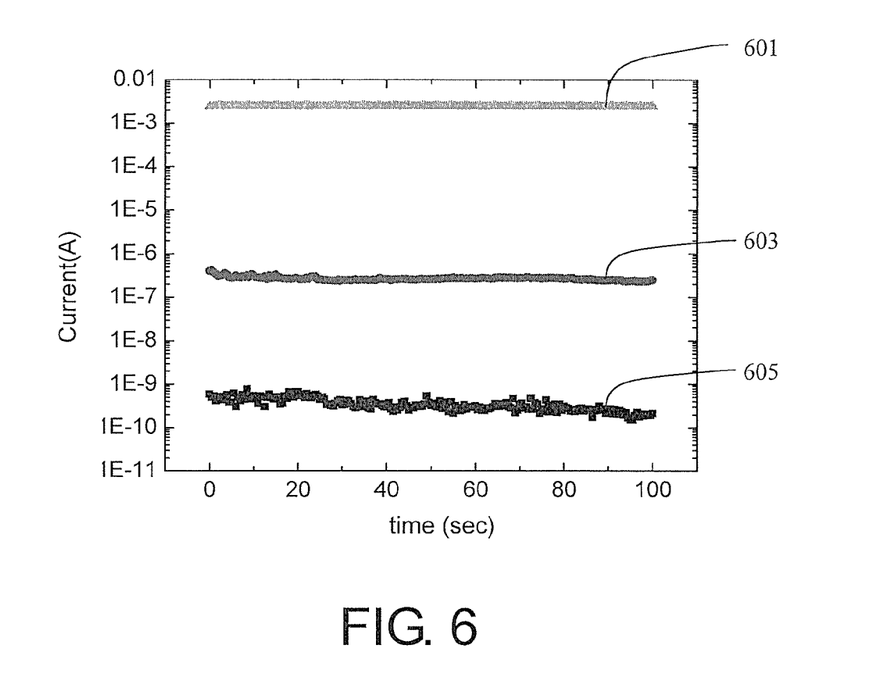
FIG. 6 is a current-time plot diagram of an organic tri-stable device under a reading voltage interference according to a preferred embodiment of the present invention.

FIG. 5 is a current-voltage plot diagram of an organic tri-stable device according to a preferred embodiment of the present invention. FIG. 6 is a current-time plot diagram of an organic tri-stable device under a reading voltage interference according to a preferred embodiment of the present invention. As shown in FIG. 5, in this embodiment, the diffusion barrier layer is made of metal indium. In FIG. 5, when the operating voltage is larger than 1.2 V (operating curve 501), the organic tri-stable device is switched to be at the first turn-on state. When the operating voltage is smaller than −0.6 V (operating curve 503), the organic tri-stable device is switched to be at the second turn-on state. Also, after the programming/erasing cycle is repeated several times, the first turn-on state voltage and the second turn-on state voltage are still steady. The experimental result shown above proves that the organic tri-stable device according to the present invention possesses relatively good stability in practical application.

As shown in FIG. 6, similar to FIG. 5, in this embodiment, the diffusion barrier layer is made of metal indium. In FIG. 6, under the reading voltage interference and the room temperature moisture content of about 30%, none of the turn-off state current (curve 605), the first turn-on state current (curve 603) and the second turn-on state current (curve 601) shows a decay tendency. That is, under the interference that the reading voltage is about 0.1 V, after 100 seconds the currents of the aforementioned three operating states still remain steady respectively.

Comparing to the conventional organic multi-stable device, the organic tri-stable device possesses three stable states. That is, a single device has multi level states. Accordingly, the numbers of the device and the area of the circuit can be decreased. Furthermore, the organic light emitting diode can be driven by a single device to achieve the gray scale control. The present invention also provides a method for manufacturing an organic tri-stable device by using a mixing evaporation process, the metal ions are added into the organic layer at the time the organic layer is formed. Hence, the organic layer possesses the metal ions. When the operating processes are performed to turn on or turn off the organic device, the adding amount of the metal ions in the organic mixture layer can be used to control the conductivity of the organic device. Additionally, the diffusion barrier layer used to block the diffusing copper can join the organic mixture layers with conductivities different from each other. Therefore, by applying the positive bias and the negative bias on the organic device, three stable states can be obtained and read.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operating process of an organic device, wherein the organic device comprises a first electrode, a second electrode, a diffusion barrier layer between the first electrode and the second electrode, the operating process comprising:

performing a programming process, wherein the programming process comprises:
when the organic device is at a turn-off state, applying a first positive bias from the first electrode to the second electrode on the organic device so that a conductive state of the organic device is switched to be a first turn-on state;
when the organic device is at the first turn-on state, applying a negative bias from the first electrode to the second electrode on the organic device so that the conductive state of the organic device is switched to be a second turn-on state; and
performing an erasing process to apply a second positive bias from the first electrode to the second electrode on the organic device so that the conductive state of the organic device is switched to be the turn-off state.

2. The operating process of claim 1, wherein the first positive bias is lower than the second positive bias.

* * * * *